United States Patent
Wu et al.

(10) Patent No.: US 10,522,345 B2
(45) Date of Patent: Dec. 31, 2019

(54) LATTICE-MISMATCHED SEMICONDUCTOR SUBSTRATES WITH DEFECT REDUCTION

(71) Applicant: Taiwan Semiconductor Manufacturing Co., Ltd., Hsin-Chu (TW)

(72) Inventors: Cheng-Hsien Wu, Hsinchu (TW); I-Sheng Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/045,618

(22) Filed: Jul. 25, 2018

(65) Prior Publication Data

US 2018/0350591 A1    Dec. 6, 2018

Related U.S. Application Data

(62) Division of application No. 15/704,992, filed on Sep. 14, 2017, now Pat. No. 10,163,628.

(Continued)

(51) Int. Cl.
*H01L 31/072* (2012.01)
*H01L 31/109* (2006.01)
(Continued)

(52) U.S. Cl.
CPC ...... *H01L 21/0243* (2013.01); *H01L 21/0262* (2013.01); *H01L 21/02381* (2013.01); *H01L 21/02433* (2013.01); *H01L 21/02546* (2013.01); *H01L 21/02639* (2013.01); *H01L 29/045* (2013.01); *H01L 29/0649* (2013.01); *H01L 29/165* (2013.01); *H01L 29/20* (2013.01);
(Continued)

(58) Field of Classification Search
CPC ......... H01L 21/02381; H01L 21/02532; H01L 21/02433; H01L 21/0245; H01L 21/02546
USPC ......................................................... 257/190
See application file for complete search history.

(56) References Cited

U.S. PATENT DOCUMENTS 8,796,666 B1    8/2014  Huang et al.
8,815,712 B2    8/2014  Wan et al.
(Continued)

FOREIGN PATENT DOCUMENTS

KR    20120012370 A    2/2012
KR    101587430 B1    1/2016
(Continued)

*Primary Examiner* — Theresa T Doan
(74) *Attorney, Agent, or Firm* — Haynes and Boone, LLP

(57) ABSTRACT

A method includes receiving a semiconductor substrate including a first semiconductor material; etching a portion of the semiconductor substrate, thereby forming a recess, a bottom portion of the recess having a first sidewall and a second sidewall intersecting with each other, one of the first and second sidewalls exposing a (111) crystallographic plane of the semiconductor substrate; and epitaxially growing a second semiconductor material in the recess, the second semiconductor material having lattice mismatch to the first semiconductor material, dislocations in the second semiconductor material due to the lattice mismatch propagating from the first sidewall to the second sidewall in a direction parallel to a top surface of the semiconductor substrate.

20 Claims, 8 Drawing Sheets

Related U.S. Application Data

(60) Provisional application No. 62/512,807, filed on May 31, 2017.

(51) Int. Cl.
  | | |
  |---|---|
  | *H01L 21/02* | (2006.01) |
  | *H01L 29/267* | (2006.01) |
  | *H01L 29/66* | (2006.01) |
  | *H01L 29/78* | (2006.01) |
  | *H01L 29/20* | (2006.01) |
  | *H01L 29/165* | (2006.01) |
  | *H01L 29/06* | (2006.01) |
  | *H01L 29/04* | (2006.01) |

(52) U.S. Cl.
  CPC ...... *H01L 29/267* (2013.01); *H01L 29/66795* (2013.01); *H01L 29/7849* (2013.01); *H01L 29/7851* (2013.01); *H01L 21/02532* (2013.01); *H01L 21/02543* (2013.01)

(56) References Cited

U.S. PATENT DOCUMENTS

| | | |
|---|---|---|
| 8,963,258 B2 | 2/2015 | Yu et al. |
| 9,093,530 B2 * | 7/2015 | Huang ................. H01L 29/785 |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2017/0062592 A1 * | 3/2017 | Basker ................ H01L 27/0924 |

FOREIGN PATENT DOCUMENTS

| | | |
|---|---|---|
| KR | 20160051685 A | 5/2016 |
| TW | 201523702 | 6/2015 |
| TW | 201543613 | 11/2015 |
| TW | 201633546 | 9/2016 |

* cited by examiner

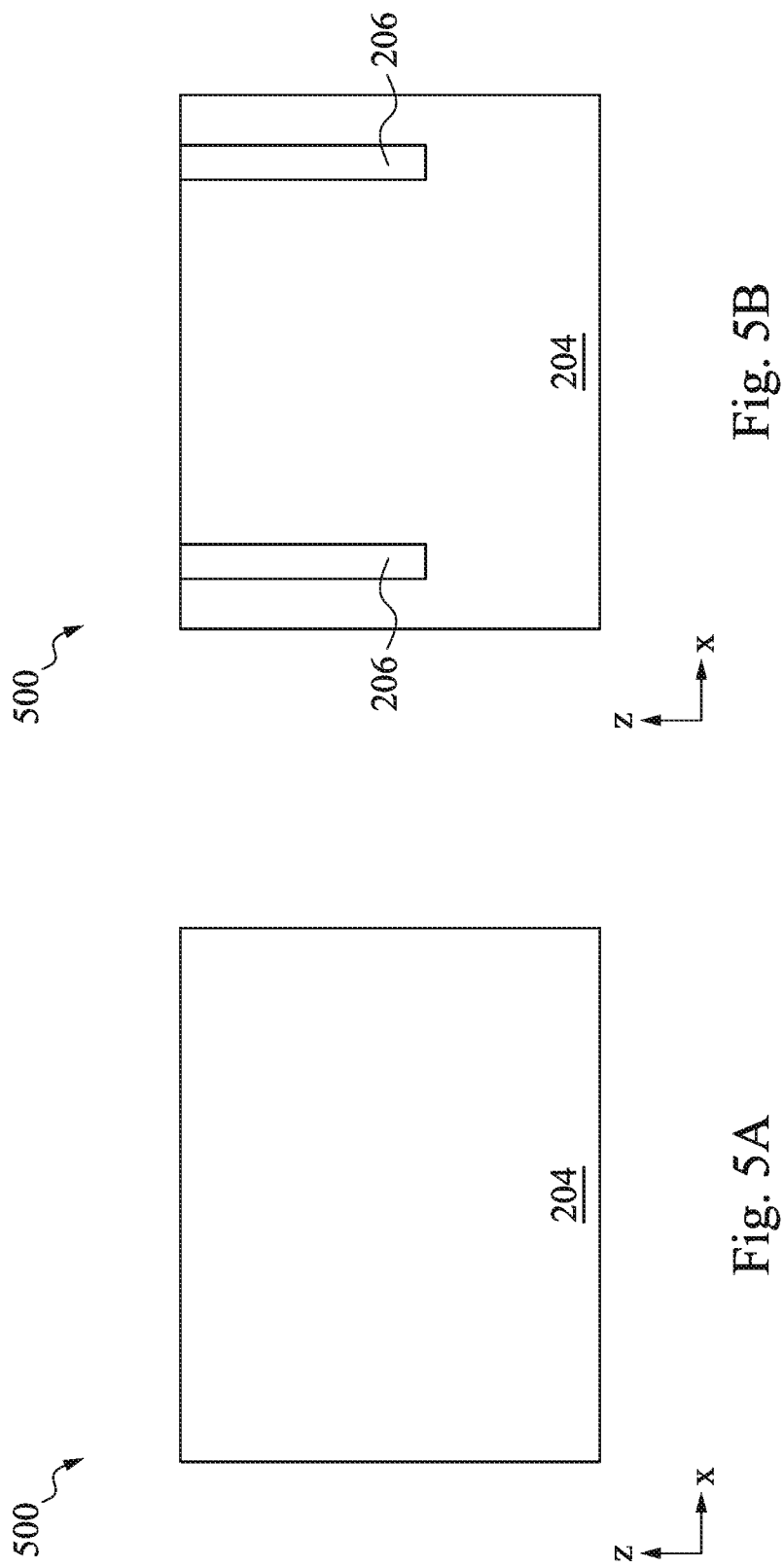

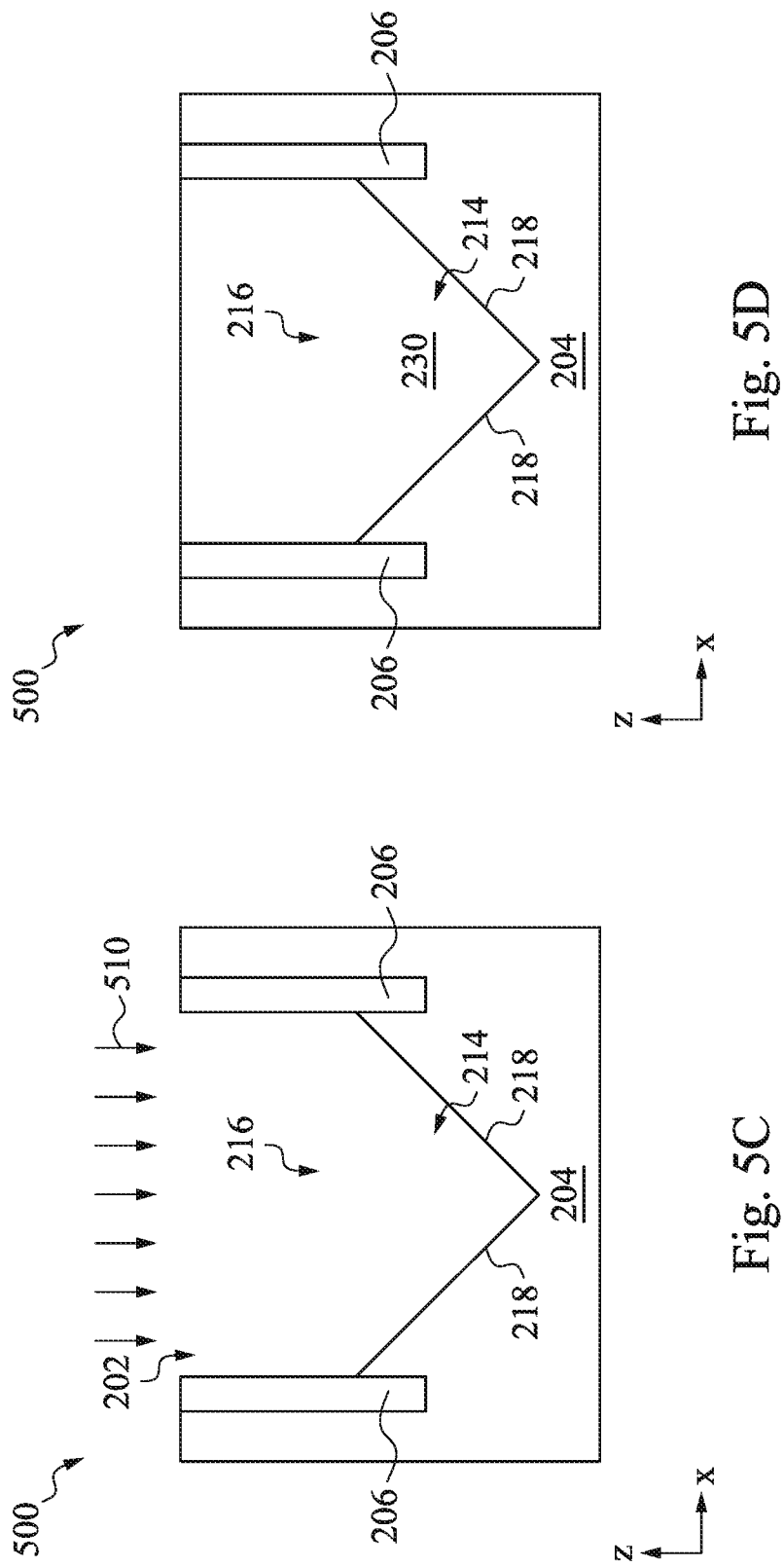

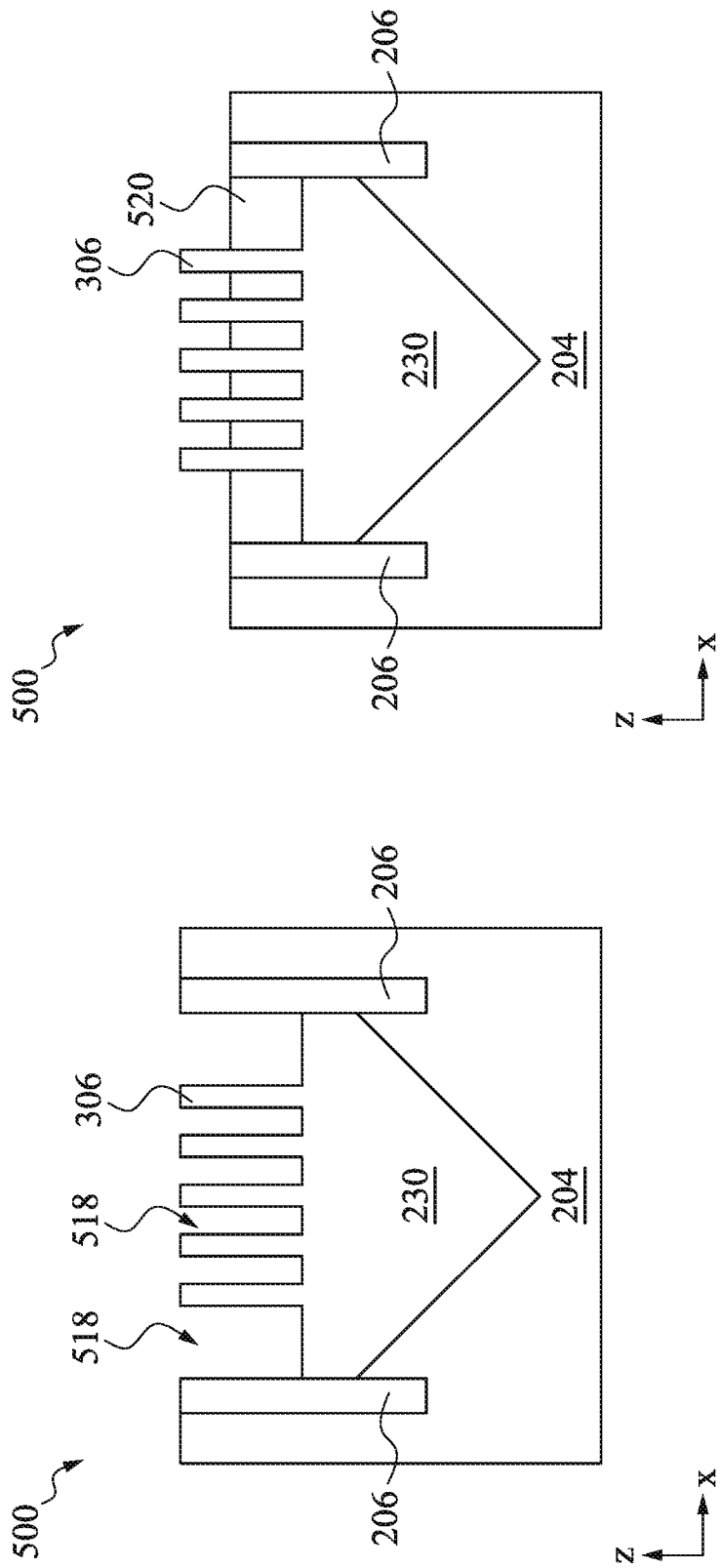

LATTICE-MISMATCHED SEMICONDUCTOR SUBSTRATES WITH DEFECT REDUCTION

PRIORITY

This is a divisional application of U.S. patent application Ser. No. 15/704,992, filed Sep. 14, 2017, which claims priority to U.S. Prov. Pat. App. Ser. No. 62/512,807 filed May 31, 2017, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Hetero-integration of dissimilar semiconductor materials, for example, III-V materials epitaxially grown on silicon or silicon-germanium substrate, has been introduced in an effort to increase the functionality and performance of field-effect transistors (FETs). Performance of devices fabricated using a combination of dissimilar semiconductor materials, however, depends on the quality of the resulting structure. Specifically, limiting dislocation defects is important in a wide variety of semiconductor devices and processes, because dislocation defects partition an otherwise monolithic crystal structure and introduce unwanted and abrupt changes in electrical properties, which, in turn, results in poor material quality and limited performance. Therefore, there is a need for a semiconductor structure and methods thereof to address these concerns for enhancing performance and reducing dislocation defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A, 5B, 5C, 5D, 5E, and 5F are cross-sectional views of the semiconductor structure, at various fabrication stages, constructed according to the method in FIG. 4, in accordance with some embodiments.

DETAILED DESCRIPTION

Figure 1A:
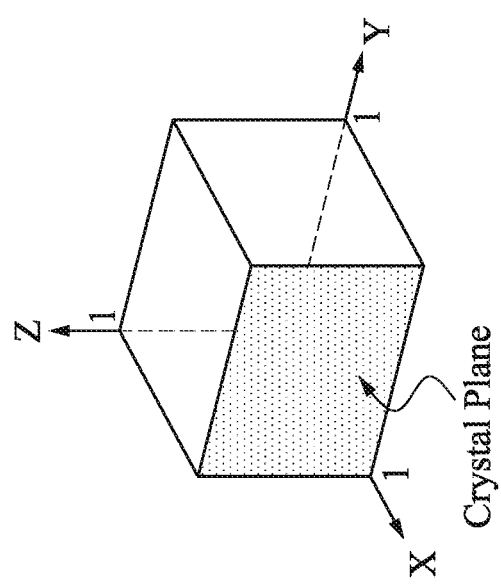
FIGS. 1A, 1B, and 1C are diagrams showing three types of crystalline orientation for silicon.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The increasing operating speeds and computing power of microelectronic devices have recently given rise to the need for an increase in the complexity and functionality of the semiconductor structures from which that these devices are fabricated. Hetero-integration of dissimilar semiconductor materials, for example, III-V materials, such as gallium arsenide, gallium nitride, indium aluminum arsenide, and/or germanium with silicon or silicon-germanium substrate, is an attractive path to increasing the functionality and performance of the semiconductor devices. However, dislocation defects typically arise when one kind of crystalline material is epitaxially grown on a substrate of a different kind of material—often referred to as "heterostructure"—due to different crystalline lattice sizes of the two materials, termed "lattice mismatch." This lattice mismatch between the starting substrate and subsequent layer(s) creates stress during material deposition that generates dislocation defects in the semiconductor structure. Such dislocation defects, or referred to as "dislocations" for simplicity, form at the mismatched interface to relieve the misfit strain. Dislocations may have vertical components continuing through all semiconductor layers subsequently added to the heterostructure, which terminate at the surface. When semiconductor devices, such as diodes, lasers, and transistors, are formed on such heterostructures, dislocations in the active regions may significantly degrade the device performance.

Thus, there is a need in the art for versatile and efficient methods of fabricating semiconductor heterostructures that would constrain dislocations in a variety of lattice-mismatched materials. There is also a need in the art for semiconductor devices utilizing a combination of integrated lattice-mismatched materials with reduced levels of dislocations for improving functionality and performance.

In accordance with its various embodiments, the present disclosure is generally related to fabrication of lattice-mismatched semiconductor heterostructures with certain regions having an upper portion substantially free of dislocations, as well as fabrication of semiconductor devices based on such lattice-mismatched hetero structures.

Figure 1B:
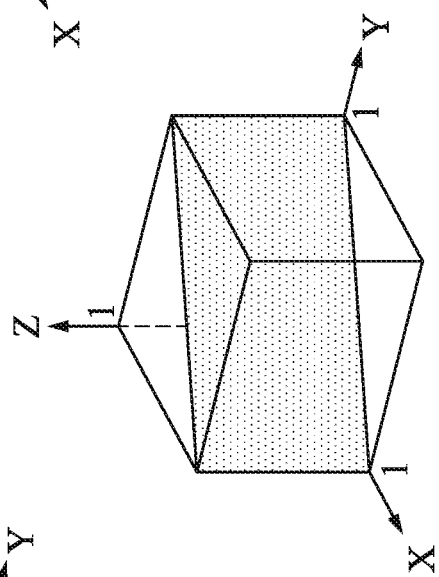
Figure 1C:
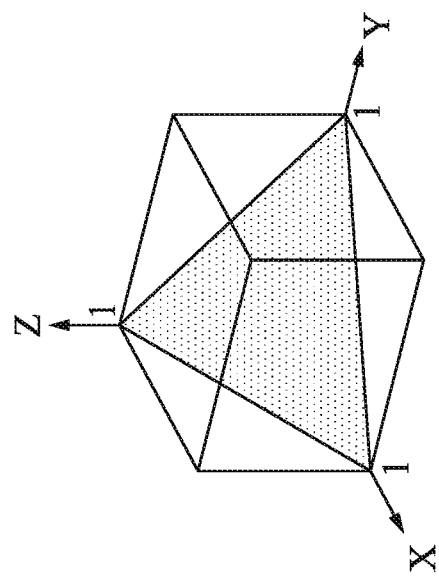

FIGS. 1A-1C show three orientations of the crystal plane of silicon. Silicon is widely used as a semiconductor material for the electronics industry. Most of silicon used to form silicon wafers is formed from single crystal silicon. The silicon wafers serve as the substrate on which field-effect transistor (FET) devices are formed. While described in connection with silicon substrates, however, the use of substrates that include, or consist essentially of, other semiconductor materials, is contemplated to be within the scope of the present invention.

In crystalline silicon, the atoms which make up the solid are arranged in a periodic fashion. If the periodic arrangement exists throughout the entire solid, the substance is defined as being formed of a single crystal. If the solid is composed of a myriad of single crystal regions, the solid is referred to as polycrystalline material. The periodic arrangement of atoms in a crystal is commonly called "the lattice." The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to the characterization of silicon crystals. In the description herein, references to various planes in silicon crystals will be made, especially to the (100), (110), and (111) planes. These planes define the orientation of the plane of silicon atoms relative to the principle crystalline axes. The numbers (xyz) are referred to as Miller indices and are determined from the reciprocals of the points at which the crystal plane of silicon intersects the principal crystalline axes. In FIG. 1A, the crystal plane of silicon intersects the x-axis at 1 and does not intersect the y-axis or z-axis. Therefore, the orientation of this type of crystalline silicon is denoted as (100). Similarly, FIG. 1B shows (110) crystalline silicon and FIG. 1C shows (111) silicon. Notably, for any given plane in a cubic crystal there are five other equivalent planes. Thus, the six sides of the cube comprising the basic unit cell of the crystal are all considered (100) planes. The notation {xyz} refers to all six of the equivalent (xyz) planes. Throughout the description, reference will also be made to the crystallographic directions, such as the [100], [110] and [111] directions. These are defined as the normal direction to the respective plane. Thus, the [100] direction is the direction normal to the (100) plane. Similarly, for any given crystallographic directions there are five other equivalent directions. The notation <xyz> refers to all six equivalent directions.

Figure 2B:
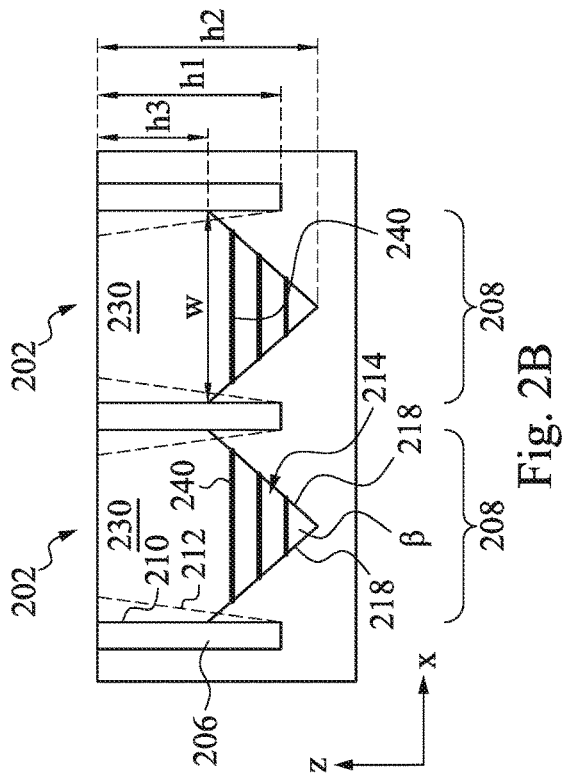
FIGS. 2B and 2C are cross-sectional views of the semiconductor structure in FIG. 2A according to various aspects of the present disclosure.
Figure 2C:
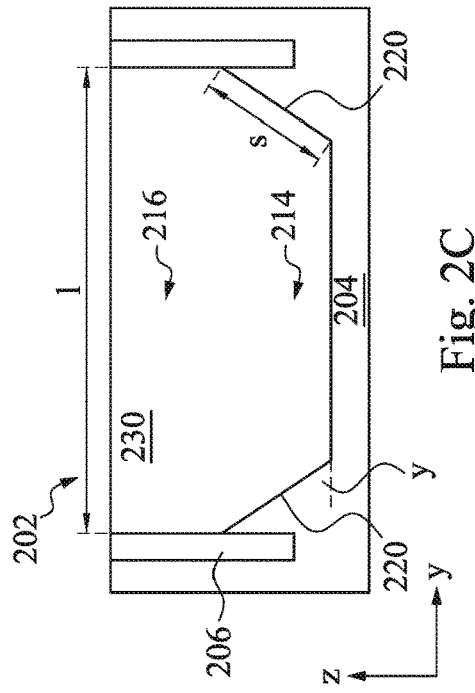
Figure 2A:
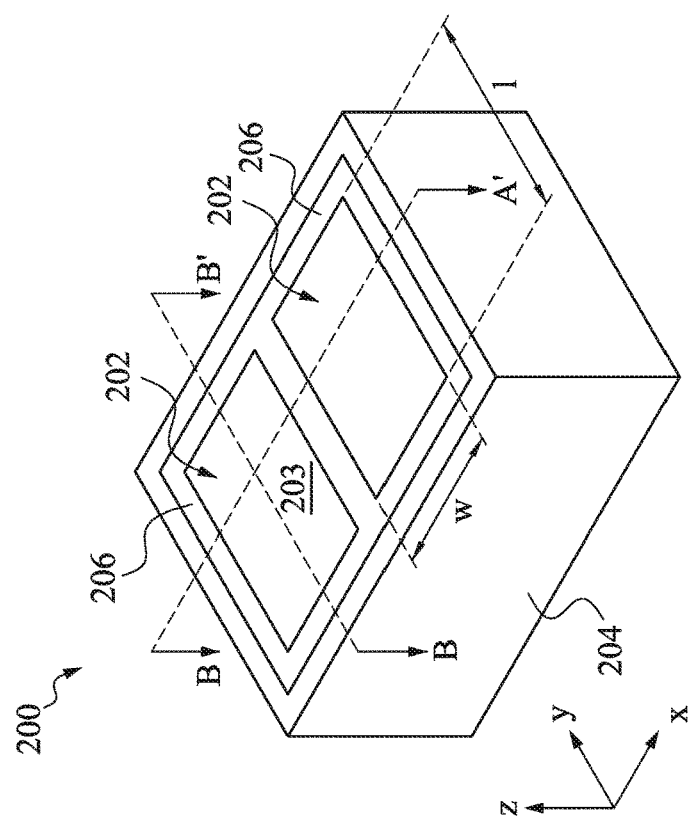
FIG. 2A is a perspective view of a semiconductor structure with a semiconductor material filling recesses with V-shape grooves according to various aspects of the present disclosure.

FIG. 2A is a perspective view of a semiconductor structure 200 (or referred to as structure 200), according to various aspects of the present disclosure. The structure 200 may be an intermediate device fabricated during processing of an integrated circuit (IC), or a portion thereof, that may comprise static random access memory (SRAM) and/or other logic circuits, passive components such as resistors, capacitors, inductors, and active components such as p-type FETs, n-type FETs, double gate FETs, tri-gate FETs, fin field-effect transistors (FinFETs), metal-oxide semiconductor field effect transistors (MOSFET), complementary metal-oxide semiconductor (CMOS) transistors, bipolar transistors, high voltage transistors, high frequency transistors, other memory cells, and combinations thereof.

FIG. 2A has been simplified for the sake of clarity and to better illustrate the concepts of the present disclosure. Additional features may be incorporated into the structure 200, and some of the features described below may be replaced or eliminated for other embodiments of the structure 200. The structure 200 in FIG. 2A has a plurality of recesses 202, each having a V-shape groove (also referred to as an inversed triangular groove) in its bottom portion. FIGS. 2B and 2C refer to cross-sections taken along the widthwise direction of the recess 202 (e.g., along A-A' line) and the lengthwise direction of the recess 202 (e.g., along B-B' line), respectively. FIGS. 2A, 2B, and 2C are herein described collectively.

The structure 200 includes a substrate 204 and various features formed therein or thereon. The substrate 204 comprises a first semiconductor material, for example, a group IV element, such as germanium or silicon, or other suitable semiconductor material. The first semiconductor material may be crystalline. The substrate 204 may be, for example, a bulk silicon wafer, a bulk germanium wafer, a semiconductor-on-insulator (SOI) substrate, or a strained semiconductor-on-insulator (SSOI) substrate. In the illustrated embodiment, the substrate 204 includes or consists essentially of (001) silicon. The substrate 204 may include a material having a first conductivity type, such as n-type or p-type.

The structure 200 further includes isolation features 206 surrounding portions of the substrate 204. The isolation feature 206 may be formed of silicon oxide, silicon nitride, silicon oxynitride, fluoride-doped silicate glass (FSG), a low-k dielectric material, and/or other suitable insulating material. The isolation features 206 may be shallow trench isolation (STI) features. In one embodiment, the depth $h_1$ of the isolation features 206 ranges from about 30 nm to about 250 nm. In another embodiment, the depth $h_1$ of the isolation features 206 ranges from about 200 nm to about 300 nm. The isolation features 206 have sidewalls 210 that are generally vertical, i.e. disposed at about 80° to about 100° with respect to the top surface of the substrate 204, and, in a particular embodiment, substantially perpendicular to the top surface of the substrate 204. In yet another embodiment, sidewalls 210 may be non-vertical, for example, along the illustrated slanted dotted line 212, such as about 60° to about 80° or about 100° to about 120° with respect to the top surface of the substrate 204. The non-vertical sidewalls 210 may be produced by different etching rates at different depths during a trench formation process for filling the isolation feature 206. The isolation features 206 define various semiconductor regions 208.

In the illustrated embodiment, each semiconductor region 208 includes a recess 202 formed therein. The recess 202 has a V-shape (or considered as substantially an inversed triangular shape) lower portion surrounded by the substrate 204, denoted as V-groove 214, and a generally rectangular upper portion surrounded by the isolation features 206, denoted as R-groove 216. In the illustrated embodiment, the depth of the recess 202 is denoted as $h_2$, the depth of the R-groove 216 is denoted as $h_3$, and the width of the V-groove 214 and the R-groove 216 are denoted as w. In some embodiments, the depth $h_2$ of the recess 202 ranges from about 200 nm to about 700 nm. In some embodiments, the depth $h_3$ of the R-groove 216 is about 5 nm to about 50 nm smaller than the depth $h_1$ of the isolation features 206. The recesses 202 are separated and isolated from each other by the isolation features 206.

In the illustrated embodiment, two sidewalls 218 of the V-groove 214 intersect with each other at a vertex, defining a V-shape in a cross-sectional view of the V-groove 214. In various embodiments, the V-groove 214 and R-groove 216 are formed by recessing the top surface of the substrate 204 in one or more etching processes. Generally, formation of the V-groove 214 may also expose (111) crystallographic planes of the substrate 204 in the sidewalls 218 and 220. For example, the V-groove 214 may be formed by applying an etchant to the substrate 204 that is selective to (111) crystallographic planes of silicon, such as, by using a potassium hydroxide (KOH) solution. The silicon atoms exhibit a hexagonal placement in the (111) crystallographic plane. In silicon lattice, the (111) and (001) crystallographic planes form an angle of 54.7°. The sidewall 218 forms an angle α with respect to the top surface of the substrate 204. The angle α is around 54.7°, such as from about 45° to about 59°, due to process variations during the etching. In some embodiments, the angle α is equal to or less than 54.7°. In some embodiments, the two sidewalls 218 form an angle β equal to or larger than 70.5°. In cross-sectional view along lengthwise of the recess 202 (FIG. 2C), the sidewall 220 of the V-groove 214 may form an angle γ with respect to the top surface of the substrate 204 substantially the same as the angle α. The dimensions of the V-groove 214, such as the depth (h2-h3), the width w, and the length s of the sidewall 220, in some embodiments, have the following relationships:

$$\begin{cases} \dfrac{w}{h3 - h2} \geq \sqrt{2} \\ \dfrac{\sqrt{3}}{2} w \geq s \end{cases}$$

The sidewalls 218 of the V-groove 214 also intersect with the sidewalls 210 of the isolation features 206. In the illustrated embodiment, the bottommost portion of the isolation features 206 is below the topmost portion of the sidewall 218 and above the bottommost portion of the V-groove 214. In some embodiments, the bottommost portion of the isolation features 206 extends further into the substrate 204 and is below the bottommost portion of the V-groove 214 as well.

The isolation features 206 surrounds the R-groove 216 above the V-groove 214. The R-groove 216 is generally rectangular with a width w and a length l. The width w may be smaller than the length l. In some embodiments, w ranges from about 50 nm to about 1000 nm. In furtherance of some embodiments, w ranges from about 100 nm to about 500 nm. In a specific example, w is about 400 nm. The length l may extend from about tens of nanometers to about thousands of nanometers.

A regrowth layer 230 that includes a second semiconductor material fills the recess 202. The second semiconductor material may be a crystalline semiconductor material. In some embodiments, the second semiconductor material exhibits lattice mismatch with the first semiconductor material in the substrate 204. In various embodiments, the first semiconductor material may include, or consist essentially of, silicon, germanium, or a silicon germanium alloy. The second semiconductor material may include, or consist essentially of, a group II, a group III, a group IV, a group V, and/or a group VI element, and/or combinations thereof, for example, selected from the group consisting of germanium, silicon germanium, gallium arsenide, aluminum antimonide, indium aluminum antimonide, indium antimonide, indium arsenide, indium phosphide, and gallium nitride. In a particular embodiment, the first semiconductor material includes germanium and the second semiconductor material includes indium arsenide.

Since the interfaces between the first and second semiconductor materials are substantially (111) crystallographic planes, the dislocations 240 due to the lattice mismatch arise from a (111) crystallographic plane. The inventors of the present disclosure have observed that dislocations originated from a (111) crystallographic plane mainly propagate through the second semiconductor material along a <110> direction, such as [-110] or [1-10] directions, which are crystallographic directions parallel to the top surface of a (001) semiconductor substrate, and terminate at another (111) crystallographic plane. This dislocation propagation pattern is termed "Taylor patterns." The Taylor patterns help releasing the strain between lattice mismatched semiconductor layers and restraining dislocations inside a region interposed between two (111) crystallographic planes. In the illustrated embodiment, as shown in FIG. 2B, the dislocation 240 arises from the sidewall 218 on one side of the V-groove 214 and propagates in a direction substantially parallel to the top surface of the substrate 204 and terminates on the sidewall 218 on another side of the V-groove 214. As a result of the geometry of the recess 202, dislocations 240 are restrained in the bottom of the recess 202 and do not propagate into the R-groove 216 above. Accordingly, the upper portion of the regrowth layer 230 is substantially free of dislocations, allowing semiconductor devices to be formed therein to have enhanced performance. This substantially dislocation free region of the regrowth layer 230 has dimensions substantially the same as the R-groove 216, with a width w and a length l. As discussed above, w and l may be in a scale of hundreds or thousands of nanometers, providing space for relatively large amount of transistors, such as FinFETs to form therein.

Figure 3B:
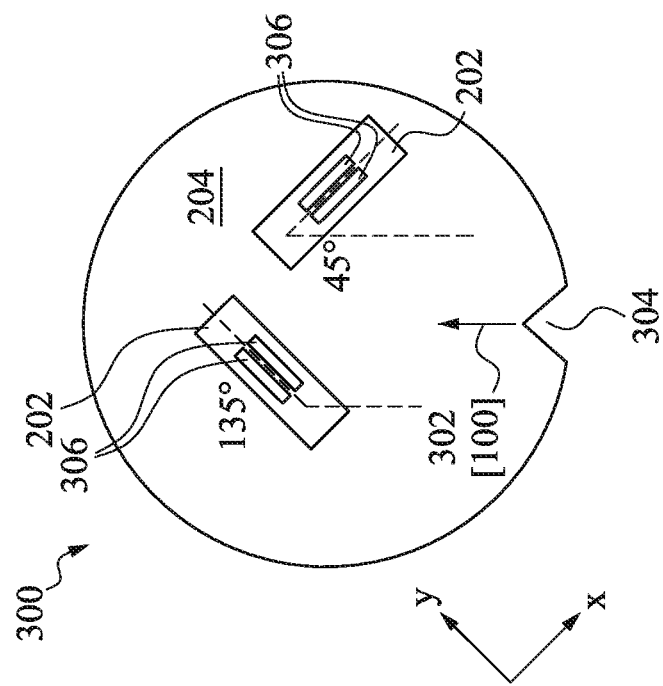
FIGS. 3A and 3B are top views of semiconductor wafers showing geometrical placement of recesses with V-shape grooves with respect to crystalline orientation of the semiconductor wafers according to various aspects of the present disclosure.
Figure 3A:
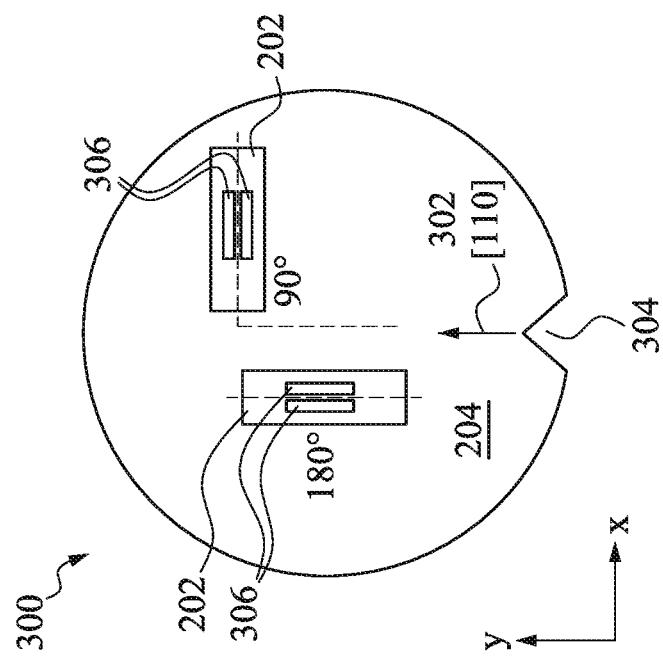

FIGS. 3A and 3B show some exemplary orientations of the recess 202 with respect to crystallographic directions on semiconductor wafers. The semiconductor wafer 300 has a crystallographic direction 302 on the top surface, for example, a [110] direction or a [100] direction. In some embodiments, the semiconductor wafer 300 has a notch 304 on its edge to mark the crystallographic direction 302. In the illustrated embodiment, a plurality of fins 306 is formed on the second semiconductor material in the recess 202. In some embodiments, the fins 306 include a channel region disposed between a pair of opposing source/drain features. The flow of carriers (electrons for an n-channel FinFET and holes for a p-channel FinFET) through the channel region is controlled by a voltage applied to a gate stack adjacent to and overlapping the fins 306 in the channel region. The fins 306 and the channel regions thereof are oriented in the same direction as the recess 202 lengthwise. Thus, the orientation of the recess 202 determines the orientation of the channel regions with respect to the crystallographic direction 302. Some orientations of the recess 202 provide better carrier mobility in the channel regions than the others. For example, in one embodiment, the crystallographic direction 302 is a [110] direction and the recess 202 is oriented lengthwise parallel or perpendicular to the [110] direction, as illustrated in FIG. 3A. In another embodiment, the crystallographic direction 302 is a [100] direction and the recess 202 is oriented lengthwise to an angle of 45° or 135° with respect to the [100] direction, as illustrated in FIG. 3B.

Figure 4:
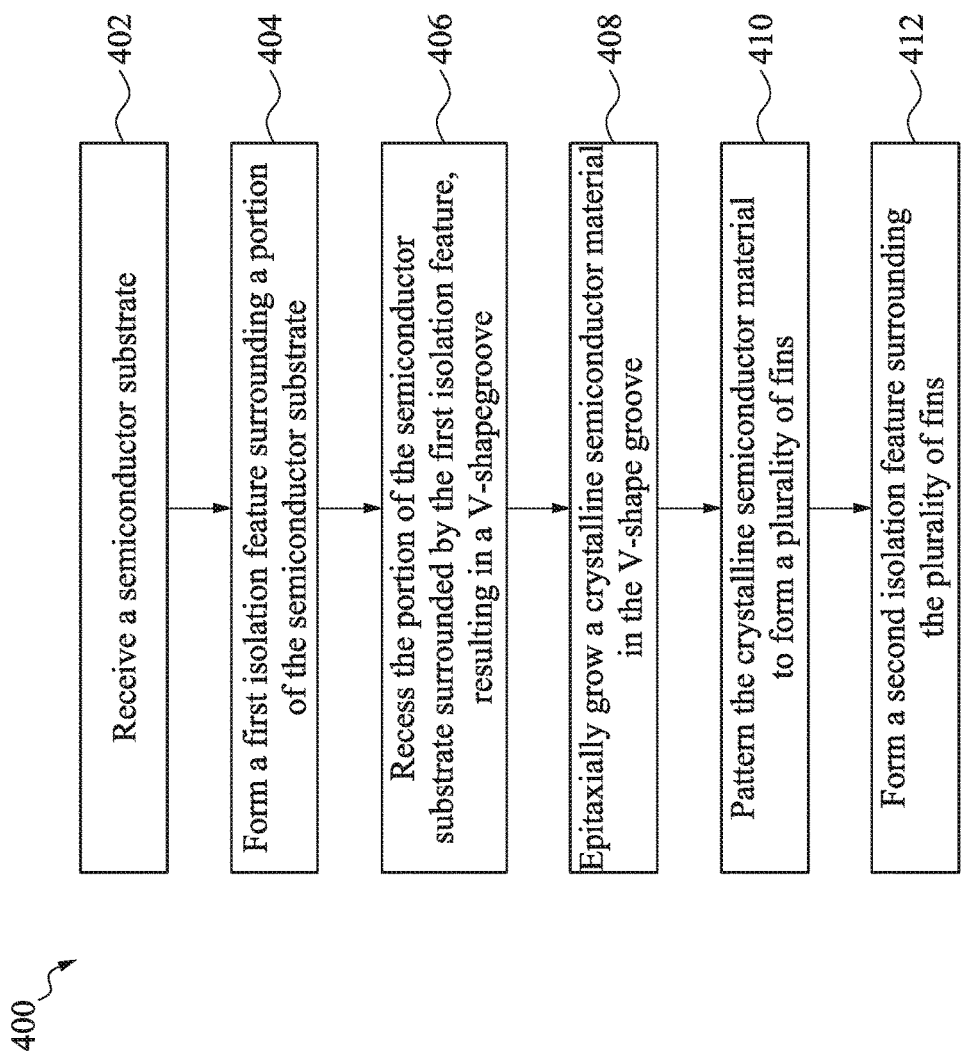
FIG. 4 is a flowchart of a method of forming a semiconductor structure with a semiconductor material filling recesses with V-shape grooves according to various aspects of the present disclosure.
Figure 6:
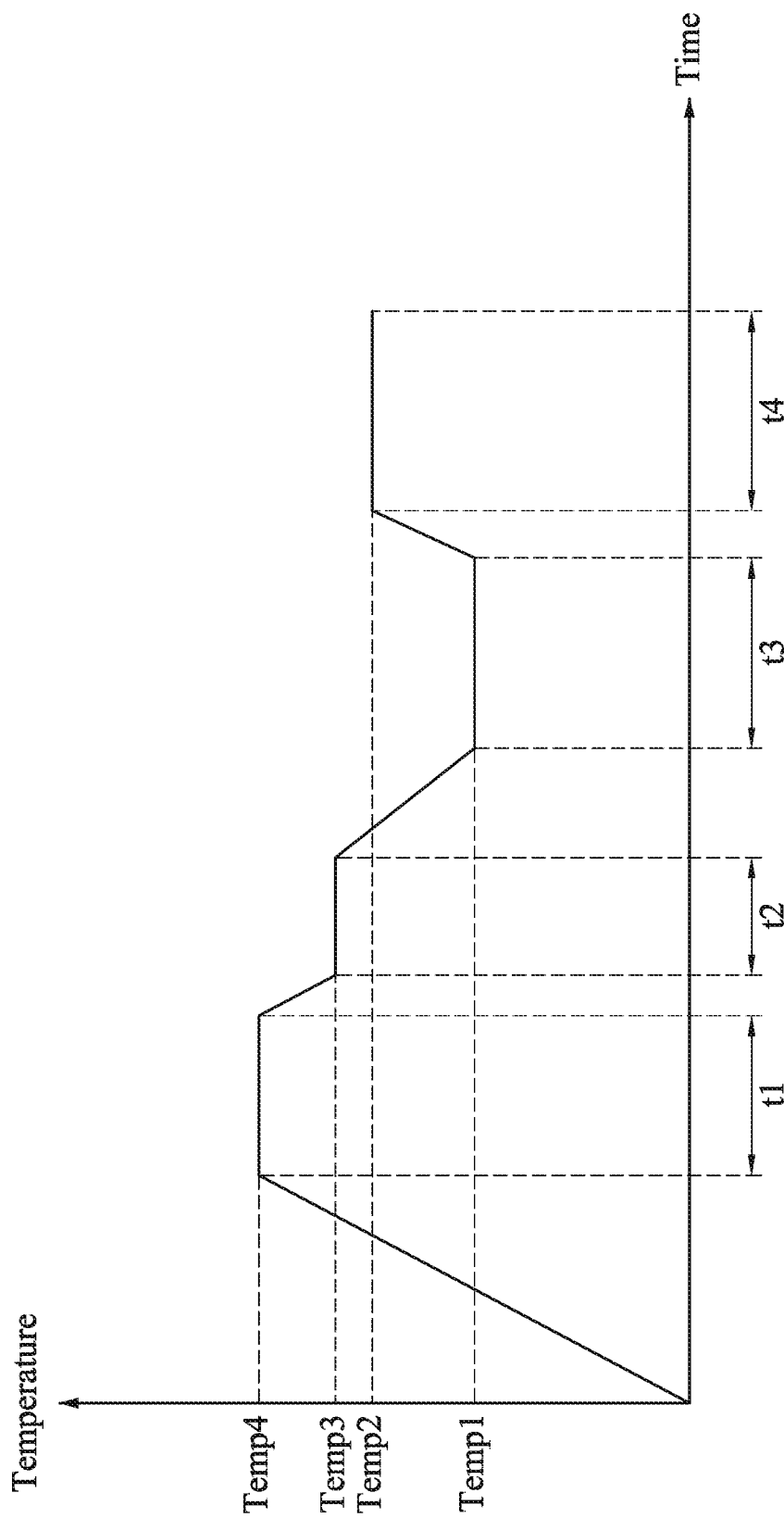
FIG. 6 is an exemplary diagram of temperature and time parameters used in an epitaxial growth process, in accordance with some embodiments.

FIG. 4 is a flowchart of a method 400 of fabricating a semiconductor structure 500 (or referred to as structure 500) with V-grooves 214 according to various aspects of the present disclosure. The structure 500 may be substantially similar to the structure 200 of FIG. 2A in many regards. Additional steps can be provided before, during, and after the method 400, and some of the steps described can be replaced or eliminated for other embodiments of the method 400. The method 400 is described below in conjunction with FIGS. 5A-5F and FIG. 6. FIGS. 5A-5F show cross-sectional views of the structure 500 at various stages of the method 400 according to some embodiments. FIG. 6 shows temperature and time parameters used in an exemplary epitaxial growth process.

Referring first to block 402 of FIG. 4 and to FIG. 5A, a structure 500 is received that includes a substrate 204 upon which the recess 202 are to be formed. In various examples, the substrate 204 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 204 may be uniform in composition or may include various layers, some of which may be selectively etched to form the recess 202. The layers may have similar or different compositions, and in various embodiments, some substrate layers have non-uniform compositions to induce device strain and thereby tune device performance. Examples of layered substrates include silicon-on-insulator (SOI) substrates. In some such examples, a layer of the substrate 204 may include an insulator such as a silicon oxide, a silicon nitride, a silicon oxynitride, a silicon carbide, and/or other suitable insulator materials. In the illustrated embodiment, the substrate 204 includes or consists essentially of (001) silicon. The substrate 204 may further be doped to have a first conductivity type, such as n-type or p-type.

Referring to block 404 of FIG. 4 and to FIG. 5B, isolation features 206 are formed in the substrate 204. In one embodiment, the forming of the isolation features 206 includes forming a hard mask with openings that define the regions for isolation features 206, etching the substrate 204 through the openings of the hard mask to form trenches, and depositing dielectric material to fill in the trenches. Suitable dielectric materials for the isolation features 206 include silicon oxides, silicon nitrides, silicon carbides, FluoroSilicate Glass (FSG), low-K dielectric materials, and/or other suitable dielectric materials. The isolation features 206 may be STI features. The sidewalls of the isolation features 206 may be non-vertical to the top surface of the substrate 204. The block 404 may further include a chemical mechanical polishing (CMP) process to remove excess dielectric materials.

Referring to block 406 of FIG. 4 and to FIG. 5C, the substrate 204 is etched to form a recess 202 interposed between isolation features 206. In various embodiments, the recess 202 includes two portions, a V-groove 214 in the bottom portion and an R-groove 216 on the top portion. The V-groove 214 may have a maximum depth corresponding to its deepest point farthest from the substrate surface and exhibit a V-shape profile. In one embodiment, the sidewall 218 of the V-groove 214 features non-(001) crystallographic planes of the first semiconductor material in the substrate 204, such as (111) crystallographic plane (e.g., a (111) silicon surface). To etch the substrate 204, the etching processes may include any suitable etching technique such as wet etching, dry etching, Reactive Ion Etching (RIE), ashing, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The etchant 510 used in the etching process does not (or insignificantly) etch the isolation features 206. Therefore, after the etching of the substrate 204, the isolation features 206 substantially remain. In some embodiments, the etching processes includes multiple etching steps with different etching chemistries, each targeting a particular portion of the substrate 204 and each selected to not etch the isolation features 206. For example, the etching processes may include an isotropic etching to form the R-groove 216 first, then followed by a wet etching with KOH or NaOH that is selective to the (111) crystallographic plane of the first semiconductor material to form the V-groove 214.

Referring to block 408 of FIG. 4 and to FIG. 5D, a regrowth layer 230 including a second semiconductor material is formed within the recess 202, filling in the V-groove 214 and the R-groove 216. The second semiconductor material may comprise a III-V material, such as GaAs, InAs, or InP, a type-IV material, such as Ge or SiGe, or an alloy or mixture including any of these materials, such as InGaP. The second semiconductor material is different from the first semiconductor material in composition. Therefore, the epitaxial growth is a hetero epitaxial growth. Especially, the first semiconductor material has a first lattice constant and the second semiconductor material has a second lattice constant that is different from the first lattice constant. Accordingly, there is lattice mismatch between the first and second semiconductor materials at the interface. In one example, the lattice mismatch is 4% or greater. Dislocations due to lattice mismatch arise from one sidewall 218, propagate along a <110> direction, and end at another sidewall 218, forming Taylor patterns. Accordingly, the upper portion of the regrowth layer 230 in the region of the R-groove 216 is substantially free of dislocations.

The regrowth layer 230 can be formed in the recess 202 by an epitaxial growth in any suitable epitaxial deposition system, including, but not limited to, atmospheric-pressure CVD (APCVD), low pressure CVD (LPCVD), ultra-high-vacuum CVD (UHVCVD), by molecular beam epitaxy (MBE), or by atomic layer deposition (ALD). In the CVD process, epitaxial growth typically includes introducing a source gas into the chamber. The source gas may include at least one precursor gas and a carrier gas, such as hydrogen. The reactor chamber is heated, such as, by RF-heating. The growth temperature in the chamber ranges from about 300°

C. to about 900° C., depending on the composition of the regrowth layer 230. The epitaxial growth system also may utilize low-energy plasma to enhance the layer growth kinetics. The epitaxial growth system may be a single-wafer or multiple-wafer batch reactor.

In one embodiment, the first semiconductor material in the substrate 204 is silicon and the second semiconductor material in the regrowth layer 230 is indium arsenide (InAs). Exemplary epitaxial growth parameters used in a CVD process are illustrated in FIG. 6. The epitaxial growth may start with pre-heating the silicon substrate to a temperature Temp4 for duration of time t1. As an example, t1 may be about 9 to 11 minutes, such as 10 minutes, and Temp4 may be in a range of about 600° C. to about 800° C., such as 720° C. In a next step, a tertiarybutylarsine (TBAs) pre-flow gas is introduced under a temperature Temp3 for duration of time t2. Temp3 may be in a range of about 500° C. to about 600° C. and t2 may be in a range of about 3 to 7 minutes, such as 5 minutes. Then an InAs buffer gas is introduced under a relatively lower temperate Temp1 for duration of time t3. Temp1 may range from about 300° C. to about 350° C. and t1 may be in a range of about 8 to 12 minutes, such as 10 minutes. Then the epitaxial growth continues at a temperature Temp2 for duration of time t4. Temp2 may range from about 400° C. to about 550° C. and t4 may be in a range of about 8 to 12 minutes, such as 10 minutes. During the CVD process, the process parameter of V/III ratio is in a range of about 50 to about 150, the gas pressure is in a range of about 50 torr to 200 torr, and the total gas flow is in a range of about 6000 sccm to about 9000 sccm.

The epitaxial growth selectively grows crystalline second semiconductor material over the first semiconductor material in the recess 202. To ensure the V-groove 214 and the R-groove 216 are filled entirely, the second semiconductor material is over grown to great extent, resulting in excessive portions of the second semiconductor material over the isolation features 206. In one example, the overgrown portions of the second semiconductor material above the isolation features 206 have a thickness ranging between about 100 nm and about 1000 nm. In another example, the overgrown portions have a thickness of about 500 nm. After the epitaxial growth of the second semiconductor material, a polishing process, such as a CMP process, may be performed to remove the overgrown portions and planarize the top surface of the structure 500.

Referring to block 410 of FIG. 4 and FIG. 5E, the second semiconductor material in the upper portion of the regrowth layer 230 is patterned to form a plurality of fins 306. This may include forming a hard mask on the regrowth layer 230 and patterning the regrowth layer 230 to define the fins 306. The hard mask may include a dielectric such as a silicon oxide, a silicon nitride, a silicon oxynitride, and/or a silicon carbide. The hard mask may be formed to any suitable thickness and by any suitable process including thermal growth, chemical vapor deposition (CVD), high-density plasma CVD (HDP-CVD), physical vapor deposition (PVD), atomic-layer deposition (ALD), and/or other suitable deposition processes. To pattern the hard mask, block 408 may include a variety of processes such as photolithography and etching. The photolithography process may include forming a photoresist over the structure 500. An exemplary photoresist includes a photosensitive material sensitive to radiation such as UV light, deep ultraviolet (DUV) radiation, and/or EUV radiation. A lithographic exposure is performed on the structure 500 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, the exposed portions of the hard mask may be removed by an etching process, such as wet etching, dry etching, RIE, ashing, and/or other etching methods, resulting in a patterned hard mask. After etching, the photoresist may be removed.

Subsequently, the regrowth layer 230 is etched using the patterned hard mask to define the fins 306. The etching processes may include any suitable etching technique such as wet etching, dry etching, RIE, ashing, and/or other etching methods. The remaining portions of the regrowth layer 230 become the fins 306, defining the trenches 518 between the fins 306 and the isolation features 206.

Referring to block 412 of FIG. 4 and FIG. 5F, the trenches 518 are filled with a dielectric material to form an isolation (STI) feature 520. The STI feature 520 is surrounded by the isolation features 206. The STI feature 520 further surrounds each of the fins 306 to isolate them. Suitable dielectric materials for the STI features 520 include silicon oxides, silicon nitrides, silicon carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. The formation of the STI feature 520 may further includes a step to planarize the top surface of the structure 500 and to remove excessive dielectric material and a step to recess the STI feature 520 by selective etching. In some embodiments, the selective etching may also recess the isolation features 206. In some embodiments, the isolation features 206 has etching selectivity to the STI feature 520, and the selective etching includes multiple etching steps that each targets at a different material composition, such as recessing the STI feature 520 in one step and recessing the isolation features 206 in another step. In some embodiments, the top surface of the substrate 204 is also recessed during the selective etching. After the selective etching, in an embodiment, the top portion of the fins 306 extend out from the STI feature 520, while the bottom portion of the fins 306 remains surrounded by the STI feature 520.

Although not shown in FIG. 4, the method 400 may proceed to further processes in order to complete the fabrication of the structure 500. For example, the method 200 may form FinFETs on the fins 306, including forming gate stacks engaging top portions of the fins, source/drain (S/D) regions, and S/D contacts and multi-layer interconnect structures that connects the gate stacks and the S/D contacts with other parts of the structure 500 to form a complete IC.

Although not intended to be limiting, one or more embodiments of the present disclosure provide many benefits to a semiconductor device and the formation thereof, including FinFETs. For example, embodiments of the present invention provide semiconductor hetero structures with significantly minimized interface defects, and methods for their fabrication, that overcome the limitations of known techniques. In its various embodiments, the present invention produces regions with relatively greater area in a scale of hundreds or thousands of nanometers to having upper portions substantially exhausted of dislocations. As a result, the invention contemplates fabrication of semiconductor devices based on monolithic lattice-mismatched heterostructures long sought in the art but heretofore impractical due to dislocation defects.

In one exemplary aspect, the present disclosure is directed to a structure. The structure includes a substrate including a first semiconductor material; a dielectric feature embedded in the substrate; and a second semiconductor material embedded in the substrate, the second semiconductor material having lattice mismatch to the first semiconductor material, the second semiconductor material having two upper sidewalls and two lower sidewalls, the two upper sidewalls in contact with the dielectric feature, the two lower sidewalls in contact with the substrate, the two lower sidewalls being non-perpendicular to a top surface of the substrate, a bottommost portion of the dielectric feature being lower than a topmost portion of the two lower sidewalls. In an embodiment, one of the two lower sidewalls defines a first angle with respect to the top surface of the substrate, the first angle being in a range from 45° to 59°. In an embodiment, the bottommost portion of the dielectric feature is lower than a bottommost portion of the two lower sidewalls. In an embodiment, one of the two lower sidewalls comprises a hexagonal crystallographic surface. In an embodiment, one of the two lower sidewalls comprises a (111) crystallographic plane defined by the first semiconductor material. In an embodiment, the second semiconductor material includes dislocations due to the lattice mismatch, the dislocations arising from one of the two lower sidewalls and terminating at another of the two lower sidewalls. In an embodiment, the dislocations propagate in a crystallographic direction paralleled to the top surface of the substrate. In an embodiment, the substrate is (001) silicon and the crystallographic direction is a <110> direction defined by the (001) silicon. In an embodiment, the two lower sidewalls intersect at a vertex, thereby defining an inversed triangular groove between the two lower sidewalls, a top width of the inversed triangular groove being at least $\sqrt{2}$ times a depth of the inversed triangular groove. In an embodiment, the top width of the inversed triangular groove is at least 50 nm. In an embodiment, the two upper sidewalls are non-perpendicular to the top surface of the substrate. In an embodiment, wherein the second semiconductor material includes a plurality of fins, the structure further includes a shallow trench isolation (STI) feature, the STI feature surrounding each of the plurality of fins.

In another exemplary aspect, the present disclosure is directed to a structure. The structure includes a substrate including a first semiconductor material, the substrate having a recess, a bottom portion of the recess having a first sidewall and a second sidewall, the first sidewall intersecting the second sidewall; an isolation feature surrounding the recess; and a second semiconductor material disposed in the recess and in contact with the first semiconductor material, the second semiconductor material having lattice mismatch to the first semiconductor material, dislocations in the second semiconductor material due to the lattice mismatch propagating from the first sidewall to the second sidewall in a direction parallel to a top surface of the substrate. In an embodiment, the first semiconductor material is (001) silicon and the direction is a <110> crystallographic direction defined by the (001) silicon. In an embodiment, the first sidewall comprises a (111) crystallographic plane defined by the (001) silicon. In an embodiment, the first sidewall and the second sidewall intersect at a vertex, thereby defining a V-shape groove between the first sidewall and the second sidewall, the V-shape groove having a top opening that has a width, the vertex having a distance to the top opening, the width being at least $\sqrt{2}$ times the distance.

In another exemplary aspect, the present disclosure is directed to a method. The method includes receiving a semiconductor substrate; forming a first isolation feature surrounding a portion of the semiconductor substrate; recessing the portion of the semiconductor substrate, thereby forming an opening in the semiconductor substrate, the opening extending lengthwise in a first direction, a bottom portion of the opening having a V-shape in a plane perpendicular to the first direction; epitaxially growing a crystalline semiconductor material in the opening; patterning the crystalline semiconductor material to form a plurality of fins, each of the plurality of fins extending lengthwise in the first direction; and forming a second isolation feature surrounding each of the plurality of fins, the second isolation feature being surrounded by the first isolation feature. In an embodiment, the semiconductor substrate is a crystalline structure defining a [110] direction along a top surface of the semiconductor substrate; and the first direction is substantially parallel or substantially perpendicular to the [110] direction. In an embodiment, a bottommost portion of the first isolation feature is lower than a bottommost portion of the opening. In an embodiment, the crystalline semiconductor material includes indium.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
receiving a semiconductor substrate including a first semiconductor material;
etching a portion of the semiconductor substrate, thereby forming a recess, a bottom portion of the recess having a first sidewall and a second sidewall intersecting with each other, one of the first and second sidewalls exposing a (111) crystallographic plane of the semiconductor substrate; and
epitaxially growing a second semiconductor material in the recess, the second semiconductor material having lattice mismatch to the first semiconductor material, dislocations in the second semiconductor material due to the lattice mismatch propagating from the first sidewall to the second sidewall in a direction parallel to a top surface of the semiconductor substrate.

2. The method of claim 1, wherein one of the first and second sidewalls defines a first angle with respect to the top surface of the semiconductor substrate, the first angle being in a range from 45° to 59°.

3. The method of claim 1, wherein the first sidewall and the second sidewall form a second angle therebetween, the second angle being no less than 70.5°.

4. The method of claim 1, wherein the first semiconductor material is (001) silicon and the direction is a <110> crystallographic direction defined by the (001) silicon.

5. The method of claim 1, further comprising:
prior to the etching of the portion of the semiconductor substrate, forming a dielectric feature surrounding the portion of the semiconductor substrate.

6. The method of claim 5, wherein a bottommost portion of the dielectric feature is lower than a topmost portion of the first and second sidewalls.

7. The method of claim 5, wherein a bottommost portion of the dielectric feature is lower than a bottommost portion of the first and second sidewalls.

8. The method of claim 1, wherein the first and second sidewalls intersect at a vertex, thereby defining an inversed triangular groove between the first and second sidewalls, a top width of the inversed triangular groove being at least $\sqrt{2}$ times a depth of the inversed triangular groove.

9. The method of claim 8, wherein the top width of the inversed triangular groove is at least 50 nm.

10. A method, comprising:
receiving a semiconductor substrate;
forming a first isolation feature surrounding a portion of the semiconductor substrate;
recessing the portion of the semiconductor substrate, thereby forming an opening in the semiconductor substrate, the opening extending lengthwise in a first direction, a bottom portion of the opening having a V-shape in a plane perpendicular to the first direction;
epitaxially growing a crystalline semiconductor material in the opening;
patterning the crystalline semiconductor material to form a plurality of fins, each of the plurality of fins extending lengthwise in the first direction; and
forming a second isolation feature surrounding each of the plurality of fins, the second isolation feature being surrounded by the first isolation feature.

11. The method of claim 10, wherein:
the semiconductor substrate is a crystalline structure defining a [110] direction along a top surface of the semiconductor substrate; and
the first direction is substantially parallel or substantially perpendicular to the [110] direction.

12. The method of claim 10, wherein a bottommost portion of the first isolation feature is lower than a bottommost portion of the opening.

13. The method of claim 10, wherein the crystalline semiconductor material includes indium.

14. The method of claim 10, wherein the first isolation feature is substantially perpendicular to a top surface of the semiconductor substrate.

15. The method of claim 10, wherein the first isolation feature is non-perpendicular to a top surface of the semiconductor substrate.

16. The method of claim 10, wherein the bottom portion of the opening exposes a (111) crystallographic plane of the semiconductor substrate.

17. The method of claim 10, wherein the crystalline semiconductor material includes dislocations due to a lattice mismatch with the semiconductor substrate, the dislocations arising from an edge of the V-shape and terminating at another edge of the V-shape.

18. A method of forming a semiconductor structure, comprising:
receiving a substrate including a first semiconductor material;
forming an isolation feature embedded in the substrate;
removing a portion of the substrate surrounded by the isolation feature, thereby forming a recess, the recess having two upper sidewalls and two lower sidewalls, the two upper sidewalls in contact with the isolation feature, the two lower sidewalls in contact with the substrate, the two lower sidewalls being non-perpendicular to a top surface of the substrate, a bottommost portion of the isolation feature being lower than a topmost portion of the two lower sidewalls; and
depositing a second semiconductor material in the recess and in contact with the first semiconductor material, the second semiconductor material having lattice mismatch to the first semiconductor material.

19. The method of claim 18, further comprising:
patterning the second semiconductor material to form a plurality of fins; and
forming a shallow trench isolation (STI) feature surrounding each of the plurality of fins.

20. The method of claim 19, wherein the STI feature is surrounded by the isolation feature.

* * * * *